(12) United States Patent
Eldredge et al.

(10) Patent No.: US 6,643,195 B2
(45) Date of Patent: Nov. 4, 2003

(54) SELF-HEALING MRAM

(75) Inventors: Kenneth J. Eldredge, Boise, ID (US);
Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/044,542

(22) Filed: Jan. 11, 2002

(65) Prior Publication Data
US 2003/0133333 A1 Jul. 17, 2003

(51) Int. Cl.[7] .................................................. G11C 7/00
(52) U.S. Cl. ................................... 365/200; 365/230.01
(58) Field of Search .......................... 365/200, 52, 55, 365/66, 97, 230.07, 230.01, 230.66, 232

(56) References Cited

U.S. PATENT DOCUMENTS

| | | |
|---|---|---|
| 5,379,258 A | 1/1995 | Murakami et al. |
| 5,877,986 A | 3/1999 | Harari et al. |
| 5,982,660 A | 11/1999 | Bhattacharyya et al. |
| 6,046,945 A | 4/2000 | Su et al. |
| 6,111,783 A | 8/2000 | Tran et al. |
| 6,119,245 A | 9/2000 | Hiratsuka |
| 6,128,239 A | 10/2000 | Perner |
| 6,163,477 A | 12/2000 | Tran |
| 6,172,935 B1 | 1/2001 | Wright et al. |
| 6,188,615 B1 | 2/2001 | Perner |
| 6,249,475 B1 * | 6/2001 | Atwell et al. .......... 365/230.03 |
| 2002/0161984 A1 * | 10/2002 | Lloyd-Jones ................ 711/203 |

OTHER PUBLICATIONS

"Double Data Rate (DDR) SDRAM", Publication No. JED-DDRDS.pm65, Rev. 0.9, 1999.

* cited by examiner

Primary Examiner—Thong Le

(57) ABSTRACT

An MRAM device includes an array of memory cells. A plurality of traces cross the memory cells. An address decoder coupled to the plurality of traces decodes an address and selects a corresponding subset of the traces. A sparing circuit coupled to the address decoder receives a logical address and outputs a physical address to the address decoder based on memory cell defect information.

19 Claims, 4 Drawing Sheets

SELF-HEALING MRAM

THE FIELD OF THE INVENTION

The invention relates to random access memory for data storage. More specifically, the invention relates to a magnetic random access memory device with self-healing capability.

BACKGROUND OF THE INVENTION

Magnetic Random Access Memory (MRAM) is a non-volatile memory that may be used for long-term data storage. An MRAM device typically includes an array of magnetic memory cells. Word lines extend along rows of the memory cells, and bit lines extend along columns of the memory cells. Each memory cell is located at a cross point of a word line and a bit line.

Each magnetic memory cell typically includes a data storage layer and a reference layer. Typically, the logic state of a magnetic memory cell depends on the relative orientations of magnetization in its data storage and reference layers. The magnetization of each memory cell assumes one of two stable orientations at any given time. These two stable orientations, parallel and anti-parallel, represent logic values of "0" and "1."

The data storage layer of a magnetic memory cell is usually a layer or film of magnetic material that stores alterable magnetization states. These alterable magnetization states typically include magnetizations that form in a direction that is parallel to what is commonly referred to as the easy axis of the data storage layer.

The reference layer of a magnetic memory cell is usually a layer of magnetic material in which magnetization is fixed or "pinned" in a particular direction. In a typical prior magnetic memory cell, the reference layer is formed so that its magnetization is pinned in a direction that is parallel to the easy axis of the data storage layer. As a consequence, the orientation of magnetization in the reference layer of a prior magnetic memory cell is typically parallel to the easy axis of the data storage layer.

A magnetic memory cell is typically in a low resistance state if the orientation of magnetization in its data storage layer is parallel to the orientation of magnetization in its reference layer. In contrast, a magnetic memory cell is typically in a high resistance state if the orientation of magnetization in its data storage layer is anti-parallel to the orientation of magnetization in its reference layer.

A prior magnetic memory cell is usually written by applying external magnetic fields that rotate the orientation of magnetization in the data storage layer from one direction to the other along its easy axis. The magnetization orientation of a selected memory cell may be changed by supplying current to a word line and a bit line crossing the selected memory cell. The currents create two orthogonal magnetic fields that, when combined, switch the magnetization orientation of a selected memory cell from parallel to anti-parallel or vice versa. This causes the magnetic memory cell to switch between its high and low resistance states.

The logic state of the magnetic memory cell may be determined during a read operation by measuring its resistance. The resistance state may be sensed by applying a voltage to a selected memory cell and measuring a sense current that flows through the memory cell. Ideally, the resistance is proportional to the sense current.

Hewlett-Packard Company, the assignee of the present invention, is also the assignee of several other patents related to MRAM technology, including: U.S. Pat. No. 6,188,615, entitled MRAM DEVICE INCLUDING DIGITAL SENSE AMPLIFIERS, filed Oct. 29, 1999, and issued Feb. 13, 2001; U.S. Pat. No. 6,163,477, entitled MRAM DEVICE USING MAGNETIC FIELD BIAS TO IMPROVE REPRODUCIBILITY OF MEMORY CELL SWITCHING, filed Aug. 6, 1999, and issued Dec. 19, 2000; U.S. Pat. No. 6,128,239, entitled MRAM DEVICE INCLUDING ANALOG SENSE AMPLIFIERS, filed Oct. 29, 1999, and issued Oct. 3, 2000; U.S. Pat. No. 6,111,783, entitled MRAM DEVICE INCLUDING WRITE CIRCUIT FOR SUPPLYING WORD AND BIT LINE CURRENT HAVING UNEQUAL MAGNITUDES, filed Jun. 16, 1999, and issued Aug. 29, 2000; and U.S. Pat. No. 5,982,660, entitled MAGNETIC MEMORY CELL WITH OFF-AXIS REFERENCE LAYER ORIENTATION FOR IMPROVED RESPONSE, filed Aug. 27, 1998, and issued Nov. 9, 1999. These patents are hereby incorporated by reference herein.

The size of memory systems is constantly increasing with time. As the size of memory systems increases, and memory cell sizes get smaller, the probability of memory bits failing, and the memory system failing, increases. Memory system failures can be the result of both temporary and permanent errors.

In order to prevent memory system failures, different forms of error detection and correction processes have evolved. One commonly used system involves the use of parity bits to detect errors. When data is received, the parity of the data is checked against an expected value. When the data does not match the expected parity value (odd or even), an error is determined to have occurred. Although this method works for determining single bit errors, it does not work well for determining multiple bit errors. Further, the simplest parity systems have no mechanism for correcting data errors.

One commonly used error detection and correction process uses error correction codes (ECC). ECC can be based on CRC (cyclic redundancy checksum or cyclic redundancy code) algorithms. ECC codes can be used to restore the original data if an error occurs that is not too disastrous. With CRC algorithms, when data is received, the complete data sequence (which includes CRC bits appended to the end of the data field) is read by a CRC checker. The complete data sequence should be exactly divisible by a CRC polynomial. If the complete data sequence is not divisible by a CRC polynomial, an error is deemed to have occurred. Other techniques, including the use of a BCH code, or a Reed-Solomon code, can be implemented. These codes provide for the correction of a very small number of errors in a data-set. The trade-off with these codes is that they require a substantial amount of data expansion for the ability to correct a small number of bits.

The parity and ECC techniques discussed above are unable to correct large bursts of "hard" or permanent errors in memories—or in order to protect against such, they require significant data expansion. In order to avoid these large bursts of errors, repairs have typically been done off-line with "fuses" or "anti-fuses", which permanently change the memory addressing. In this technique, commonly referred to as "sparing," the bad bits are typically re-mapped to a spare block of bits. The identification of errors and the repairs typically occur in memory manufacturing, and the fuses are not updated "on the fly" during operation of the device by the end customer. With such a technique, the number of spare blocks of memory must be determined at the time of design of the memory device.

In commonly-assigned U.S. patent application No. 09/766,354, filed Jan. 19, 2001, and entitled SELF- HEALING MEMORY, a technique is disclosed for providing a self-healing dynamic random access memory (DRAM) using a "hot spare row" for on-line sparing. On-line self-healing capability has not been provided, however, for a block-oriented memory device like an MRAM.

It would be desirable to provide an MRAM memory with an on-line self-healing capability that is not limited to a predetermined number of spare blocks of memory.

SUMMARY OF THE INVENTION

One form of the present invention provides an MRAM device including an array of memory cells. A plurality of traces cross the memory cells. An address decoder coupled to the plurality of traces decodes an address and selects a corresponding subset of the traces. A sparing circuit coupled to the address decoder receives a logical address and outputs a physical address to the address decoder based on memory cell defect information.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
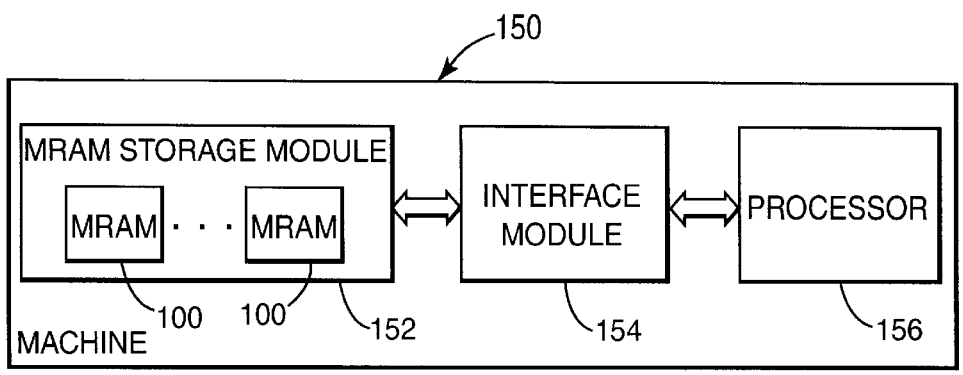
FIG. 1 is an electrical block diagram illustrating a device incorporating multiple MRAM chips according to one embodiment of the present invention.

An MRAM device according to one embodiment of the present invention could be used in a wide variety of applications. FIG. 1 shows an exemplary general application for one or more MRAM chips 100. The general application is embodied by a machine 150 including an MRAM storage module 152, an interface module 154 and a processor 156. The MRAM storage module 152 includes one or more MRAM chips 100 for long term storage. The interface module 154 provides an interface between the processor 156 and the MRAM storage module 152. The machine 150 could also include fast volatile memory (e.g., SRAM) for short-term storage.

For a machine 150 such as a notebook computer or personal computer, the MRAM storage module 152 might include a number of MRAM chips 100 and the interface module 154 might include an EIDE or SCSI interface. For a machine 150 such as a server, the MRAM storage module 152 might include a greater number of MRAM chips 100, and the interface module 154 might include a fiber channel or SCSI interface. Such MRAM storage modules 152 could replace or supplement conventional long-term storage devices such as hard drives.

For a machine 150 such as a digital camera, the MRAM storage module 152 might include a smaller number of MRAM chips 100 and the interface module 154 might include a camera interface. Such an MRAM storage module 152 would allow long-term storage of digital images on-board the digital camera.

Figure 2:
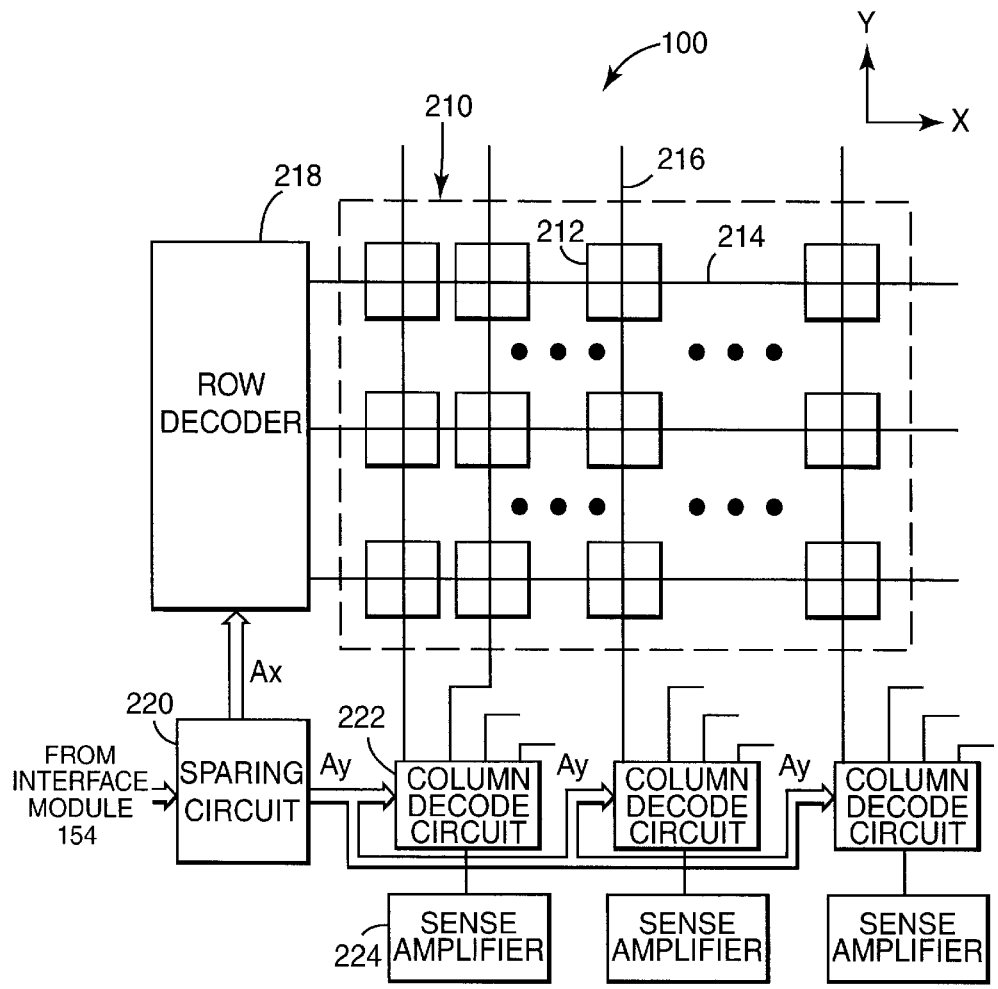
FIG. 2 is an electrical block diagram illustrating an MRAM device according to one embodiment of the present invention.

FIG. 2 illustrates an MRAM device 100 including an array 210 of memory cells 212. The memory cells 212 are arranged in rows and columns, with the rows extending along an x-direction and the columns extending along a y-direction. Only a relatively small number of memory cells 212 are shown to simplify the description of the invention. In practice, arrays of 1024×1024 memory cells or larger may be used.

Traces functioning as word lines 214 extend along the x-direction in a plane on one side of the memory cell array 210. Traces functioning as bit lines 216 extend along the y-direction in a plane on an opposite side of the memory cell array 210. In one embodiment, there is one word line 214 for each row of the array 210 and one bit line 216 for each column of the memory cell array 210. Each memory cell 212 is located at a crossing point of a corresponding word line 214 and bit line 216.

MRAM device 100 senses the resistance of selected memory cells 212 during read operations, and orients the magnetization of selected memory cells 212 during write operations.

MRAM device 100 includes a row decoder 218 for selecting word lines 214 and a plurality of column decode circuits 222 (also referred to as column decoder 222) for selecting bit lines 216 during read and write operations. A memory cell 212 is selected by supplying a row address Ax to the row decoder 218 and a column address Ay to column decoder 222. In response to the row address Ax, row decoder 218 couples a corresponding word line 214 to ground. In response to the column address Ay, column decoder 222 couples a corresponding bit line 216 to a sense amplifier 224. A selected memory cell 212 lies at the cross point of selected word and bit lines 214 and 216. Sense amplifiers 224 sense the logic state of selected memory cells 212.

The row addresses Ax and the column addresses Ay are supplied to row decoder 218 and column decoder 222, respectively, by sparing circuit 220. In one embodiment, sparing circuit 220 receives a logical address from processor 156 through interface module 154, and converts the received logical address to a physical address based on stored memory cell defect information. Row decoder 218 and column decoder 222 use the physical addresses provided by sparing circuit 220 to select corresponding memory cells 212.

Figure 3:
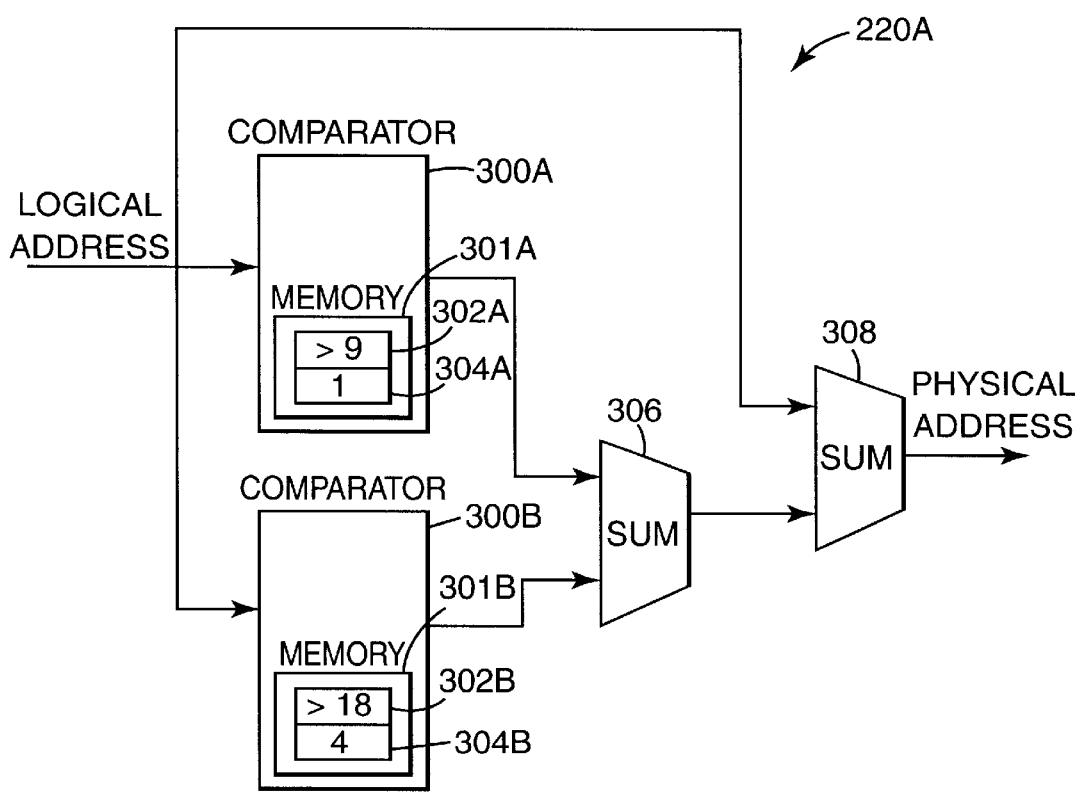
FIG. 3 is an electrical block diagram illustrating one embodiment of a sparing circuit according to the present invention.

FIG. 3 is an electrical block diagram illustrating one embodiment 220A of a sparing circuit 220 according to the present invention. Sparing circuit 220A includes comparators 300A and 300B (collectively referred to as comparators 300), and summing circuits 306 and 308. To simplify the explanation and illustration of the invention, only two comparators 300 are shown in FIG. 3. In alternative embodiments, additional comparators 300 may be used, or a single comparator 300 may be used.

Comparators 300A and 300B include memories 301A and 301B, respectively. Memory 301A stores a comparison value 302A and an offset value 304A. In the example shown in FIG. 3, for comparator 300A, the comparison value 302A is "9," and the offset value 304A is "1." For comparator 300B, the comparison value 302B is "18," and the offset value 304B is "4." The comparison values are derived based on the location (physical address) of memory defects in the MRAM device 100. The offset values are derived based on the number of consecutive memory defects.

A logical address is received by comparators 300 and by summing circuit 308. Comparators 300 each compare the received logical address to their stored comparison values 302A and 302B. In the embodiment illustrated in FIG. 3, the comparison is a "greater than" comparison. In alternative embodiments, other types of comparisons are used. Comparator 300A determines if the received logical address is greater than "9." If the received logical address is greater than "9," comparator 300A outputs the stored offset value 304A (e.g., "1"). If the received logical address is not greater than "9," comparator 300A outputs an offset value of "0." Similarly, comparator 300B determines if the received logical address is greater than "18." If the received logical address is greater than "18," comparator 300B outputs the stored offset value 304B (e.g., "4"). If the received logical address is not greater than "18," comparator 300A outputs an offset value of "0."

Summing circuit 306 sums the offset values output by comparators 300, and outputs the sum to summing circuit 308. Summing circuit 308 adds the sum of the offset values to the received logical address to generate a physical address, which summing circuit 308 outputs to row decoder 218 and/or column decoder 222. In one embodiment, two sparing circuits are provided in MRAM device 100. One sparing circuit generates physical address values for rows (Ax) and a second sparing circuit generates physical address values for columns (Ay).

The example comparison values 302A and 302B, and the offset values 304A and 304B, shown in FIG. 3, are derived based on having defects at physical memory addresses 10, and 20–23. If a logical address is received by sparing circuit 220A that corresponds to one of these defective locations, sparing circuit 220A maps the received logical address to a non-defective physical address. For example, for logical addresses 0–9, comparators 300 both output a "0" offset value, and the physical address output by summing circuit 308 is the same as the received logical address. For logical addresses 10–18, comparator 300A outputs a "1" offset value, and comparator 300B outputs a "0" offset value. These offset values are summed and added to the logical address, so logical addresses 10–18 are mapped to physical addresses 11–19, respectively, thereby skipping defective physical address location 10. For logical addresses greater than 18, comparator 300A outputs a "1" offset value, and comparator 300B outputs a "4" offset value. These offset values are summed and added to the logical address, so logical address 19 is mapped to physical address 24, and logical addresses above 19 are also mapped to physical addresses offset by a value of 5. Thus, defective physical address locations 20–23 are skipped.

Figure 4:
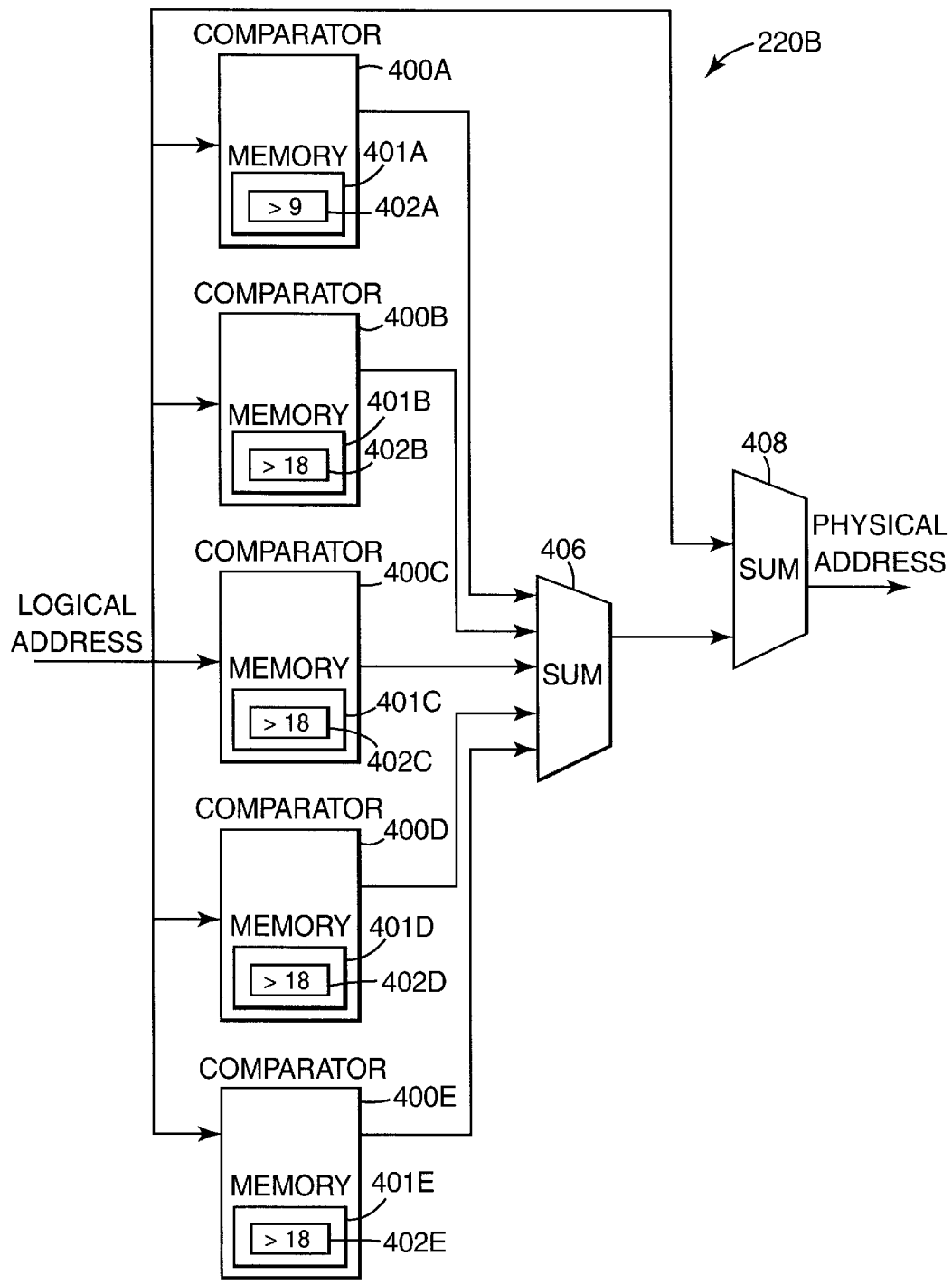
FIG. 4 is an electrical block diagram illustrating an alternative embodiment of a sparing circuit according to the present invention.

FIG. 4 is an electrical block diagram illustrating an alternative embodiment 220B of a sparing circuit 220 according to the present invention. Sparing circuit 220B includes comparators 400A–400E (collectively referred to as comparators 400), and summing circuits 406 and 408. To simplify the explanation and illustration of the invention, only five comparators 400 are shown in FIG. 4. In alternative embodiments, additional comparators 400 may be used, or a lesser number of comparators 400 may be used.

Comparators 400A–400E include memories 401A–401E, respectively. Memories 401A–401E store comparison values 402A–402E, respectively. In the as example shown in FIG. 4, for comparator 400A, the comparison value 402A is "9." For comparators 400B–400E, the comparison values 402B–402E are each "18." The comparison values are derived based on the location (physical address) of memory defects in the MRAM device 100.

A logical address is received by comparators 400 and by summing circuit 408. Comparators 400 each compare the received logical address to their stored comparison values 402A–402E. In the embodiment illustrated in FIG. 4, the comparison is a "greater than" comparison. In alternative embodiments, other types of comparisons are used. Comparator 400A determines if the received logical address is greater than "9." If the received logical address is greater than "9," comparator 400A outputs an offset value of "1." If the received logical address is not greater than "9," comparator 400A outputs an offset value of "0." Similarly, comparators 400B–400E determine if the received logical address is greater than "18." If the received logical address is greater than "18," comparators 400B–400E each output an offset value of "1." If the received logical address is not greater than "18," comparators 400A–400E each output an offset value of "0."

Summing circuit 406 sums the offset values output by comparators 400, and outputs the sum to summing circuit 408. Summing circuit 408 adds the sum of the offset values to the received logical address to generate a physical address, which summing circuit 408 outputs to row decoder 218 and/or column decoder 222.

Like the example values shown in FIG. 3, the example comparison values 402A–402E shown in FIG. 4 are derived based on having defects at physical memory addresses 10, and 20–23. If a logical address is received by sparing circuit 220B that corresponds to one of these defective locations, sparing circuit 220B maps the received logical address to a non-defective physical address. For example, for logical addresses 0–9, comparators 400A–400E each output a "0" offset value, and the physical address output by summing circuit 408 is the same as the received logical address. For logical addresses 10–18, comparator 400A outputs a "1" offset value, and comparators 400B–400E each output a "0" offset value. These offset values are summed and added to the logical address, so logical addresses 10–18 are mapped to physical addresses 11–19, respectively, thereby skipping defective physical address location 10. For logical addresses greater than 18, comparators 400A–400E each output a "1" offset value. These offset values are summed and added to the logical address, so logical address 19 is mapped to physical address 24, and logical addresses above 19 are also mapped to physical addresses offset by a value of 5. Thus, defective physical address locations 20–23 are skipped.

A primary difference between sparing circuit 220A and sparing circuit 220B is that sparing circuit 220A uses comparators 300 that store and output offset values 304A–304B, while sparing circuit 220B uses comparators 400 that output a true/false (e.g., 1 or 0) value based on comparisons. The storing of offset values is more efficient for error or defect clusters, while the use of true/false values works well for randomly scattered errors or defects.

It will be understood by a person of ordinary skill in the art that functions performed by sparing circuit 220 may be implemented in hardware, software, firmware, or any combination thereof. The implementation may be via a microprocessor, programmable logic device, or state machine.

In one embodiment, the comparison values 302 and 402 and the offset values 304 are stored in a sparing table in non-volatile memory to maintain the memory mapping information during power-down of MRAM device 100. In an MRAM device 100 with multiple planes of memory cell arrays 210, a separate sparing table may be maintained for each plane.

In one form of the invention, memory defects are identified during manufacture of MRAM device 100, and the comparison values 302 and 402 and the offset values 304 are programmed accordingly during manufacture to cause sparing circuit 220 to "jump over" the identified memory defects. Since fuses are not used in one embodiment, less chip area is needed for the address decoders. In one embodiment, processor 156 is configured to automatically change and/or add comparison values 302 and 402 and offset values 304 "on the fly" based on errors or defects identified using conventional error detection techniques (e.g., ECC) after manufacture and during normal operation of MRAM device 100. Thus, MRAM device 100 can jump over memory defects that arise after MRAM device 100 is manufactured and is in use by an end user.

In an alternative embodiment of the present invention, a hybrid approach is used for dealing with memory defects. Fuses or anti-fuses are used for defects that are identified during manufacture of MRAM device 100, and sparing circuit 220 is used for defects that are identified after manufacture.

In one form of the invention, the self-healing capability of MRAM device 100 is not limited to a single spare block of memory. As defects arise during operation of MRAM device 100, processor 156 updates the comparison values 302 and 402 and the offset values 304, which results in a progressive offset or sliding scale mapping of logical addresses to physical addresses. A defective block is not simply re-mapped to a spare block, as in prior devices. There are no dedicated spare blocks in one form of the invention. It may be impractical to discard a memory device because it contains more defects than can be "fixed" with a dedicated block of spare memory. By using a progressive offset, an MRAM chip 100 with any number of defects can still be used. The storage capacity visible to the end user would be less than was available at manufacture, but the device would still be operational.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An MRAM device comprising:

an array of memory cells;

a plurality of rows of traces crossing the memory cells;

a plurality of columns of traces crossing the memory cells;

a row decoder coupled to the plurality of rows of traces for decoding a row address and selecting at least one of the rows of traces;

a sparing circuit coupled to the row decoder for receiving a logical address and outputting a physical address to the row decoder and wherein the sparing circuit includes a plurality of comparators for comparing the received logical address to comparison values, the comparison values based on memory cell defect information, each of the comparators configured to output an offset value based on the comparison, and wherein the physical address is generated based on a sum of the offset values and the logical address.

2. The MRAM device of claim 1, and further comprising:

a column decoder coupled to the plurality of columns of traces for decoding a column address and selecting at least one of the columns of traces, the column decoder coupled to the sparing circuit, the sparing circuit configured to output a physical address to the column decoder based on the memory cell defect information.

3. The MRAM device of claim 1, wherein the sparing circuit further comprises a first summing circuit coupled to the comparators for adding the offset values output by the comparators and outputting a combined offset value.

4. The MRAM device of claim 3, and further comprising a second summing circuit coupled to the first summing circuit for adding the combined offset value to the received logical address to generate the physical address.

5. The MRAM device of claim 3, wherein the offset value output by each comparator is one of a logical "1" and a logical "0".

6. The MRAM device of claim 3, wherein the offset value output by at least one of the comparators is greater than 1.

7. The MRAM device of claim 1, wherein the comparison values are stored in a non-volatile memory.

8. The MRAM device of claim 1, wherein the offset values are stored in a non-volatile memory.

9. A method of selecting at least one memory cell in a block-oriented memory device for read/write operations, the method comprising:

identifying defective memory cells in the memory device;

receiving a logical address;

comparing the received logical address to a plurality of comparison values, the comparison values based on the identified defective memory cells;

generating an offset value for each of the comparisons, thereby generating a plurality of offset values;

generating a physical address by adding the plurality of offset values and the received logical address; and selecting at least one memory cell in the memory device for a read/write operation based on the generated physical address.

10. The method of claim 9, wherein the memory device is an MRAM device.

11. The method of claim 9, wherein the step of identifying defective memory cells comprises:

identifying defective memory cells during manufacture of the memory device.

12. The method of claim 11, wherein the step of identifying defective memory cells further comprises:

identifying defective memory cells after manufacture of the memory device during normal operation of the memory device.

13. The method of claim 9, and further comprising:

storing sparing information in a non-volatile memory, the sparing information including data for mapping logical addresses to physical addresses based on a progressive offset to jump over the identified defective memory cells.

14. The method of claim 13, and further comprising:

identifying the offset values based on data from the stored sparing information.

15. A sparing circuit for an MRAM device comprising:

a plurality of comparators configured to receive a logical address and compare the received logical address to comparison values, the comparison values based on locations of memory cell defects in the MRAM device, each of the comparators configured to output an offset value based on the comparison; and at least one summing circuit configured to receive the offset values and the logical address, the summing circuit configured to add the received offset values to the received logical address, thereby generating a physical address to be provided to at least one address decode circuit of the MRAM device.

16. The sparing circuit of claim 15, wherein the comparison values are stored in a non-volatile memory.

17. The sparing circuit of claim 15, wherein the offset values output by the comparators are stored in a non-volatile memory.

18. The sparing circuit of claim 16, wherein the MRAM device is configured to modify the stored comparison values based on identified memory errors.

19. The sparing circuit of claim 17, wherein the MRAM device is configured to modify the stored offset values based on identified memory errors.

* * * * *